United States Patent
Lin et al.

(10) Patent No.: US 10,020,279 B2
(45) Date of Patent: Jul. 10, 2018

(54) SEMICONDUCTOR DEVICE INCLUDING BUILT-IN CRACK-ARRESTING FILM STRUCTURE

(71) Applicant: International Business Machines Corporation, Armonk, NY (US)

(72) Inventors: Wei Lin, Albany, NY (US); Leathen Shi, Yorktown Heights, NY (US); Spyridon Skordas, Troy, NY (US); Kevin R. Winstel, East Greenbush, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/209,269

(22) Filed: Jul. 13, 2016

(65) Prior Publication Data

US 2016/0322324 A1    Nov. 3, 2016

Related U.S. Application Data

(62) Division of application No. 14/543,986, filed on Nov. 18, 2014, now Pat. No. 9,536,853.

(51) Int. Cl.
*H01L 23/00* (2006.01)
*H01L 33/00* (2010.01)
*H01L 21/18* (2006.01)

(52) U.S. Cl.
CPC ............ *H01L 24/32* (2013.01); *H01L 21/187* (2013.01); *H01L 23/562* (2013.01); *H01L 24/05* (2013.01); *H01L 24/08* (2013.01); *H01L 24/27* (2013.01); *H01L 24/29* (2013.01); *H01L 24/80* (2013.01); *H01L 24/83* (2013.01); *H01L 24/94* (2013.01); *H01L 33/0079* (2013.01); *H01L 24/03* (2013.01); *H01L 2224/03452* (2013.01); *H01L 2224/03845* (2013.01); *H01L 2224/04* (2013.01); *H01L 2224/04026* (2013.01); *H01L 2224/0519* (2013.01); *H01L 2224/0569* (2013.01); *H01L 2224/05073* (2013.01);

(Continued)

(58) Field of Classification Search
CPC ..................... H01L 33/0079; H01L 21/76251; H01L 24/94
See application file for complete search history.

(56) References Cited

U.S. PATENT DOCUMENTS 9,536,853 B2    1/2017  Lin
2008/0280420 A1*  11/2008  Yamazaki ......... H01L 21/02032
                                                              438/458

OTHER PUBLICATIONS

"Porous Dielectrics in Microelectronic Wiring Applications" on Materials 2010, 3, 536-562, Vincent McGahay.*

(Continued)

*Primary Examiner* — Moazzam Hossain
*Assistant Examiner* — Farun Lu
(74) *Attorney, Agent, or Firm* — Cantor Colburn LLP; Steven Meyers

(57) ABSTRACT

A wafer-to-wafer semiconductor device includes a first wafer substrate having a first bonding layer formed on a first bulk substrate layer. A second wafer substrate includes a second bonding layer formed on a second bulk substrate layer. The second bonding layer is bonded to the first bonding layer to define a bonding interface. At least one of the first wafer substrate and the second wafer substrate includes a crack-arresting film layer configured to increase a bonding energy of the bonding interface.

6 Claims, 8 Drawing Sheets

(52) U.S. Cl.
CPC ............... *H01L 2224/05082* (2013.01); *H01L 2224/05187* (2013.01); *H01L 2224/05687* (2013.01); *H01L 2224/08145* (2013.01); *H01L 2224/27452* (2013.01); *H01L 2224/2919* (2013.01); *H01L 2224/29023* (2013.01); *H01L 2224/29083* (2013.01); *H01L 2224/29187* (2013.01); *H01L 2224/32145* (2013.01); *H01L 2224/80896* (2013.01); *H01L 2224/80907* (2013.01); *H01L 2224/80948* (2013.01); *H01L 2224/838* (2013.01); *H01L 2224/83896* (2013.01); *H01L 2224/83907* (2013.01); *H01L 2224/83948* (2013.01); *H01L 2224/94* (2013.01); *H01L 2924/05442* (2013.01); *H01L 2924/06* (2013.01); *H01L 2924/0715* (2013.01)

(56) References Cited

OTHER PUBLICATIONS

Wei Lin, "Semiconductor Device Including Built-In Crack-Arresting Film Structure", U.S. Appl. No. 14/543,986, filed Nov. 18, 2014.
List of IBM Patents or Patent Applications Treated as Related; (Appendix P), Filed Jul. 13, 2016; 2 pages.
Wei Lin, "Semiconductor Device Including Built-In Crack-Arresting Film Structure", U.S. Appl. No. 15/491,329, filed Apr. 19, 2017.

* cited by examiner

SEMICONDUCTOR DEVICE INCLUDING BUILT-IN CRACK-ARRESTING FILM STRUCTURE

DOMESTIC PRIORITY

This application is a divisional of U.S. patent application Ser. No. 14/543,986, filed Nov. 18, 2014, the disclosure of which is incorporated by reference herein in its entirety.

BACKGROUND

The present invention relates generally to semiconductor device fabrication, and more specifically, to semiconductor devices formed using wafer-to-wafer bonding techniques.

Wafer-to-wafer bonding is a three-dimensional integration and/or packaging process that is typically used to improve packaging size and protect sensitive internal structures of the semiconductor device from environmental influences such as, for example, temperature, moisture, high pressure and oxidizing species. Referring to FIG. 1, a semiconductor device 100 formed according to a conventional wafer-to-wafer bonding processes typically includes a first wafer 102a bonded to a second wafer 102b. The first wafer 102a and the second wafer 102b define an oxide-oxide bonding interface 104 formed therebetween.

Conventional semiconductor devices 100 formed according to conventional wafer-to-wafer bonding processes are susceptible to the formation of uniform cracks 108 in one or more oxide layers 106a/106b defining the oxide-oxide bonding interface 104 (see FIG. 2). In the case of FIG. 2, the crack has been initiated in the process of measuring bond energy by using the well-known Maszara method. The crack length extending along the X-axis from edge towards center can be determined and the bond energy can in turn be determined by inserting a thin blade to initiate a crack form the edge of the bonded wafer pair. The Maszara method describes the relationship of the crack length and bonding energy as:

$$\gamma = \frac{3Et^3h^2}{32L^4}, \quad \text{Equation (1)}$$

where, t is the wafer thickness, h is the thickness of the blade, and L the length of the induced crack.

Longer bond cracks suggest a weaker bonding process, which is undesirable. The uniform cracks 108 extend deep into the oxide layer at a distance (d1) and indicate a pulling/peeling separation phenomenon between the opposing oxide layers 106a/106b bonded at the oxide-oxide bonding interface 104. The pulling/peeling separation is typically such that little force is required to separate the two opposing conventional semiconductor wafers 102a/102b at the oxide-oxide bonding interface 104. This can result in delamination and process yield losses during downstream processing with respect to wafer-scale bonding and multi-stacking.

Conventional methods for improving wafer-to-wafer bonding processes are directed to enhancing the cohesive and adhesive bonding energy of the specific oxide layers 106a/106b that define the oxide-oxide bonding interface 104. For example, various materials having increased toughness have been selected to form the individual oxide layers 106a/106b in an attempt to prevent the formation of uniform cracks. According to other conventional methods, various surface chemistries have been applied to the individual oxide layers 106a/106b in an attempt to strength the oxide material and achieve increase the bonding energy at the oxide-oxide bonding interface 104.

SUMMARY

According to at least one embodiment of the present invention, a wafer-to-wafer semiconductor device includes a first wafer substrate having a first bonding layer formed on a first bulk substrate layer. A second wafer substrate includes a second bonding layer formed on a second bulk substrate layer. The second bonding layer is bonded to the first bonding layer to define a bonding interface. At least one of the first wafer substrate and the second wafer substrate includes a crack-arresting film layer configured to increase a bonding energy of the bonding interface.

According to another embodiment, a semiconductor wafer comprises an oxide layer formed on an upper surface of a substrate layer. The substrate layer and oxide layer each extend along a first axis to define a length and a second axis opposite the first axis to define a thickness. A crack-arresting layer is formed on an upper surface of the oxide layer. A bonding layer is formed on an upper surface of the crack-arresting layer. The crack-arresting layer is configured to inhibit formation of at least one uniform crack in the bonding layer.

According to yet another embodiment, a method of fabricating a semiconductor device comprises forming a first semiconductor wafer including a first bonding layer on a first crack-arresting film layer. The method further includes forming a second semiconductor wafer including a second bonding layer. The method further includes bonding the first bonding layer to the second bonding layer such that a stronger bond is induced at a bonding interface defined by the first and second bonding layers.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIGS. 3-5 are a series of views illustrating a process flow of forming a semiconductor wafer according to a non-limiting embodiment of the invention, in which:

FIG. 3 is a cross-sectional view of a semiconductor wafer including a bulk substrate layer having an oxide layer formed on an upper surface thereof;

FIG. 4 illustrates the semiconductor wafer of FIG. 3 having a crack-arresting film layer formed on an upper surface of the oxide layer; and FIG. 5 illustrates the semiconductor wafer of FIG. 4 having a bonding layer formed on an upper surface of the crack-arresting film layer.

DETAILED DESCRIPTION

Figure 3:
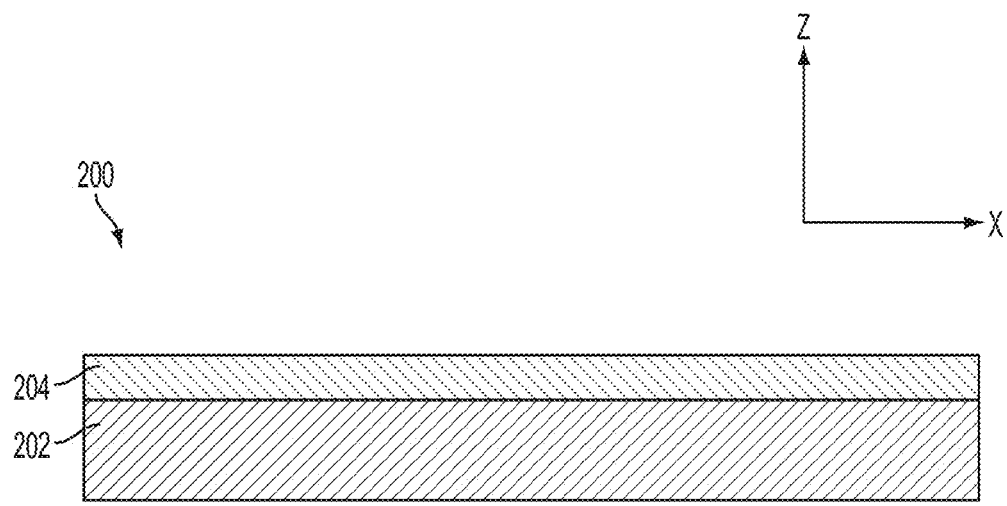

With reference now to FIG. 3, a first semiconductor wafer 200 for forming a wafer-to-wafer semiconductor device is illustrated according to a non-limiting embodiment. The first semiconductor wafer 200 includes a bulk substrate layer 202 having an oxide layer 204 formed on an upper surface thereof. The bulk substrate layer 202 extends along a first axis (X-axis) to define a length and a second axis (Z-axis) perpendicular to the first axis to define a height (i.e., thickness). According to a non-limiting embodiment, the bulk substrate layer 202 is formed from, for example, silicon (Si).

The oxide layer 204 is deposited on the bulk substrate layer 202 using a chemical vapor deposition (CVD) or low pressure chemical vapor deposition (LPCVD) process, for example, and is typically formed from various materials including, but not limited to, tetraethyl orthosilicate (Si $(OC_2H_5)_4$) to form silicon dioxide ($SiO_2$) layer. The thickness of the oxide layer initially deposited on the bulk substrate layer 202 can range from 300 nanometers (nm) to 10 microns (μm), for example.

The oxide layer 204 can further be planarized using a chemical-mechanical planarization (CMP) process as understood by one of ordinary skill in the art. The surface resulting from the CMP process provides a smooth and flat topography that enhances formation of a bonding layer thereon, which is discussed in greater detail below. The thickness of the oxide layer 204 following the planarization process can range from approximately 100 nm to approximately 5000 nm, for example.

The bulk substrate layer 202 and/or the oxide layer 204 can include various front end of line (FEOL) components and/or back end of the line (BEOL) components (not specifically shown in FIG. 3). The FEOL components may include, but are not limited to, transistors, capacitors, resistors. The BEOL components may include, but are not limited to, electrically conductive contacts, insulating/dielectric layers, metal levels, conductive vias/wirings, and bonding sites.

Figure 4:
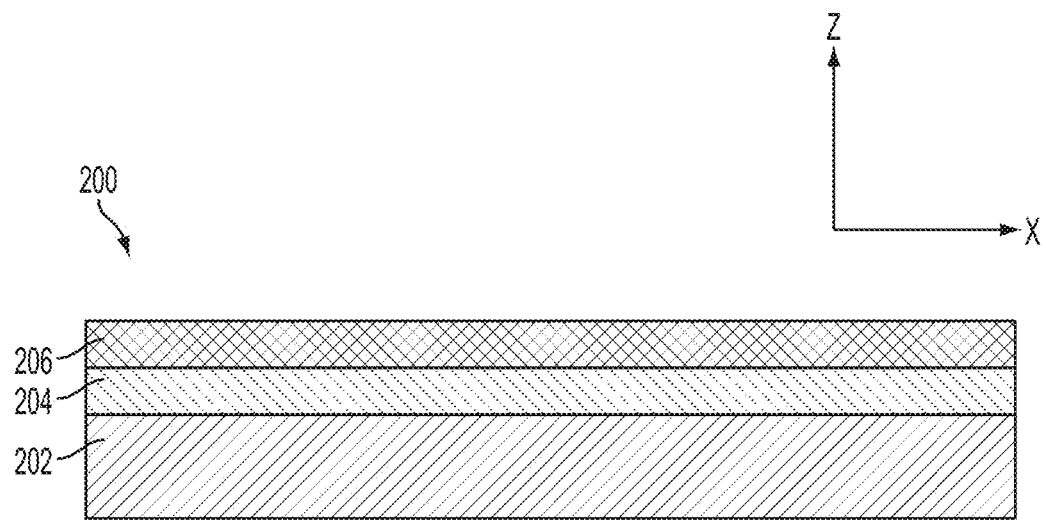

Referring to FIG. 4, the semiconductor wafer 200 of FIG. 3 is illustrated having a crack-arresting film layer 206 formed on an upper surface of the oxide layer 204. The crack-arresting film layer 206 may be formed from one or more various low-dielectric (i.e., low-k) materials including, but not limited to, octamethylcyclotetrasiloxane (OMCT), and can be deposited using, for example, a CVD or LPCVD process as understood by one of ordinary skill in the art. The crack-arresting film layer 206 has a thickness ranging from approximately 10 nm to approximately 200 nm.

Figure 5:
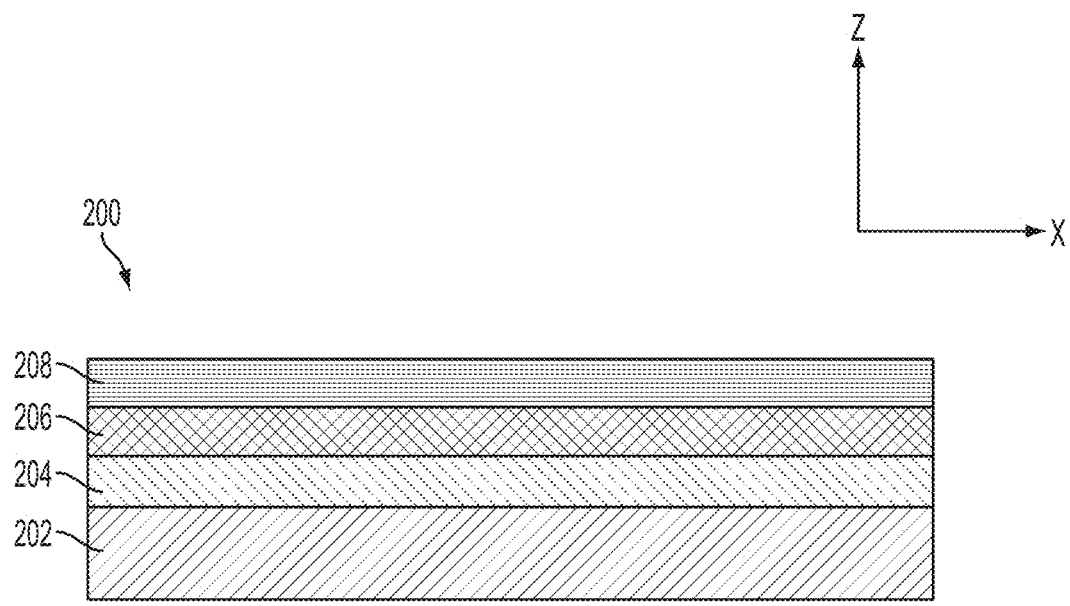

Referring now to FIG. 5, a bonding layer 208 is formed on an upper surface of the crack-arresting film layer. The bonding layer 208 is formed from, for example, a low temperature oxide (LTO) layer 208. In this manner, on the top surface of the semiconductor wafer is formed a multi-layer bonding stack that has a thickness extending along the Z-axis, which includes a crack-arresting film layer 206 configured to inhibit cracking and thus increase the bonding energy between a pair of bonded semiconductor wafers as discussed in greater detail below. The LTO layer 208 is deposited on the crack-arresting film layer 206 using a CVD or LPCVD process, for example, and is formed from various low temperature oxide materials including, but not limited use of silane ($SiH_4$) and other silicon precursors of the silanes family to form the desired low-temperature oxide by CVD or LPCVD. The LTO layer 208 has a thickness ranging from approximately 30 nm to approximately 500 nm, for example.

It is appreciated that the LTO layer 208 can be activated prior to performing a wafer-to-wafer bonding process using, for example, a wet activation process or a plasma activation process. The wet activation process includes application of a hydrogen fluoride (HF) solution, hydrogen chloride (HCl) solution, or ammonia ($NH_3$) solution on to the LTO layer 208. Alternatively, the plasma activation process injects nitrogen, oxygen, and/or carbon ions into the LTO layer 208. It is appreciated that a de-ionization (DI) rinse process may be performed following the plasma activation process. The DI rinse process can include a solution doped with carbon dioxide ($CO_2$), for example, to remove the electrostatic charge from the surface of the LTO layer 208.

According to a non-limiting embodiment, the thickness of the LTO layer 208 is equal to, or substantially equal to, the thickness of the crack-arresting film layer 206. In this manner, unexpected results are realized in that crack-arresting film layer 206 and the LTO layer 208 are prevented from overwhelming or acting against one another in terms of relative stress/strain. Accordingly, crack inhibition in the LTO layer 208 is enhanced, thereby enhancing the bonding energy at the oxide-oxide bonding interface of a wafer-to-wafer bonded semiconductor device by significantly reducing the probability and the extent of crack-driven failure and delamination.

Conventional semiconductor devices obtained through conventional oxide wafer bonding exclude a crack-arresting film layer in the bonding stack. Consequently, these conventional semiconductor devices have weaker bonding energy at the bonding interface as evidenced by large, uniform cracks 108, especially at the bonded wafer pair edge (see FIG. 2). These large uniform cracks 108 are indicative of lower bonding energy between opposing bonding layers, thereby pointing to easier separation of conventional semiconductor wafers 102a/102b at the bonding layer interface 104 (see FIG. 1), which is undesirable.

Figure 2:
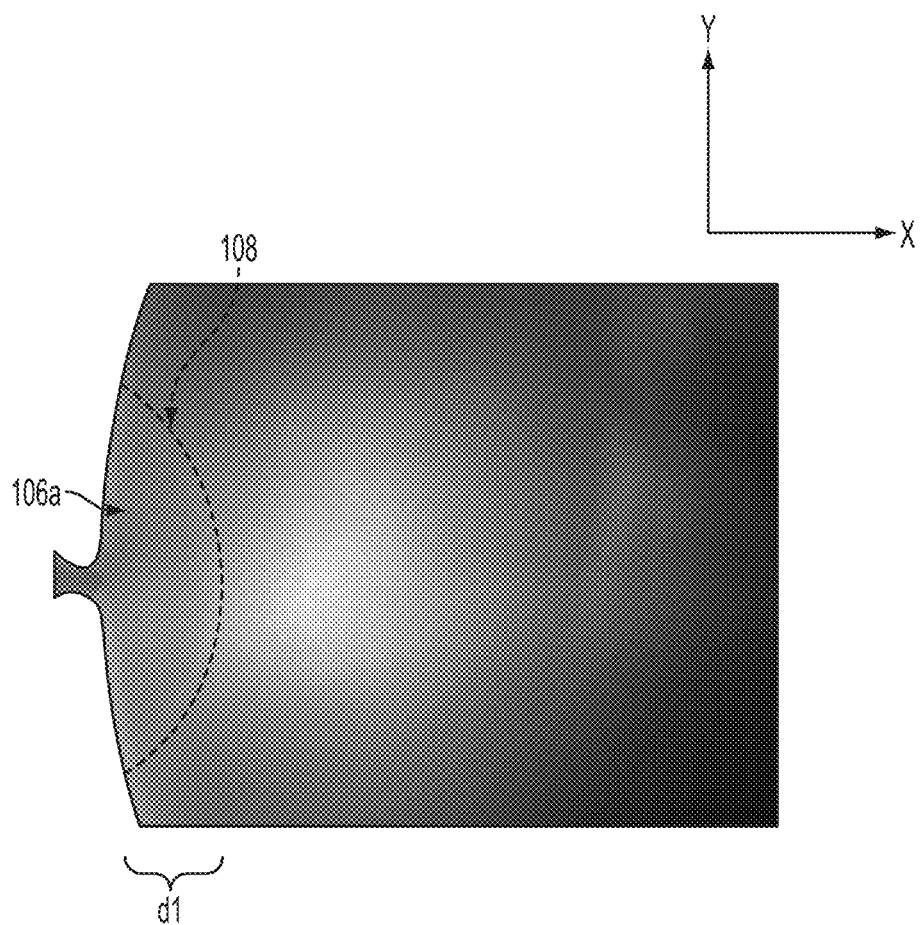
FIG. 2 illustrates a uniform crack formed in an oxide layer of a semiconductor wafer forming a conventional wafer-to-wafer semiconductor device.

At least one non-limiting embodiment of the invention, however, includes an LTO layer 208 (i.e., bonding layer 208) formed on an upper surface of a crack-arresting film layer 206. The crack-arresting film layer 206 inhibits cracking in the LTO layer 208 of the semiconductor wafer 200. In this manner, cracks are inhibited from propagating deep in to the LTO layer 208 once initiated. When measured by the Maszara method, the inhibition of cracks from progressing into the LTO layer 208 causes any cracking that may occur to be confined within a narrower edge area where the crack was initiated. This signifies that a stronger force would be required to separate a bonded pair of wafers from each other at the bonding interface. That is, the crack-arresting film layer prevents cracks from propagating further toward the center of the bonded wafer structure in contrast to cracks 108 that extend along a single axis (i.e., the X-axis) such as shown in FIG. 2. The cracks induced when various embodiments of the disclosure are implemented are therefore shorter than the longer uniform cracks found in bonding layers of conventional wafer-to-wafer semiconductor devices. That is, the cracks propagate into the bonding layer, e.g., LTO layer 208, at a distance (d2) that is less than the distance (d1) of uniform cracks 108 formed in conventional semiconductor wafers. Accordingly, the semiconductor wafer 200 according to at least one embodiment of the invention has an enhanced and more reliable bonding interface, which increases the bonding energy at the oxide-oxide interface of a wafer-to-wafer bonded semiconductor device, as described in greater detail below. This reduces the probability of delamination and thus minimizes process yield losses form the bonding process.

Figure 6:
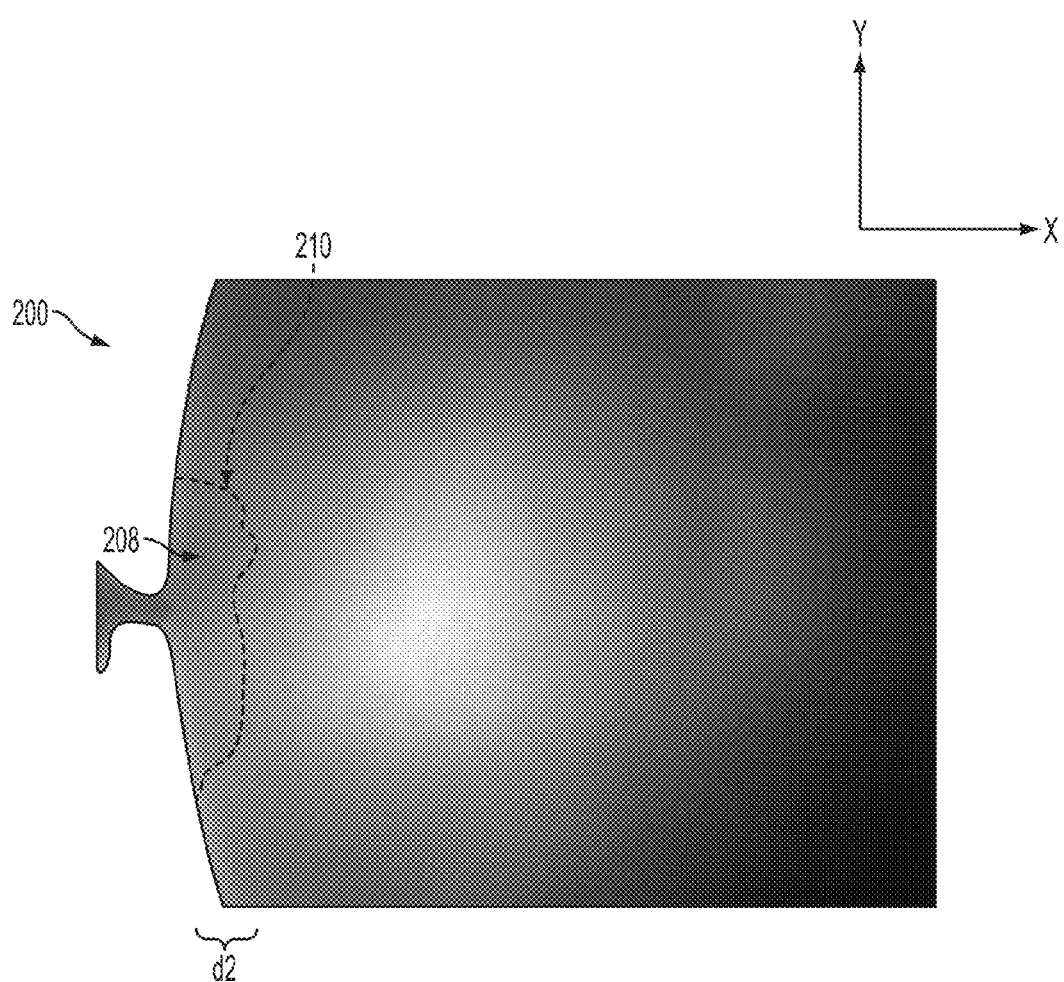
FIG. 6 illustrates a branched crack formed in a bonding layer of a wafer-to-wafer bonded semiconductor device formed according to a non-limiting embodiment of the invention.

As illustrated in FIG. 6, the inhibition of crack propagation in the LTO layer 208 (i.e., bonding layer) is evidenced by the formation narrower cracks 210 confined more to the edge of the wafer, as opposed to the wider cracks 108 formed in the oxide layer 106a/106b of conventional wafer-to-wafer semiconductor device 100 (see FIG. 2). That is, the combination of the crack-arresting film layer 206 and the LTO layer 208 according to at least one embodiment of the invention inhibits crack propagation.

Figure 7:
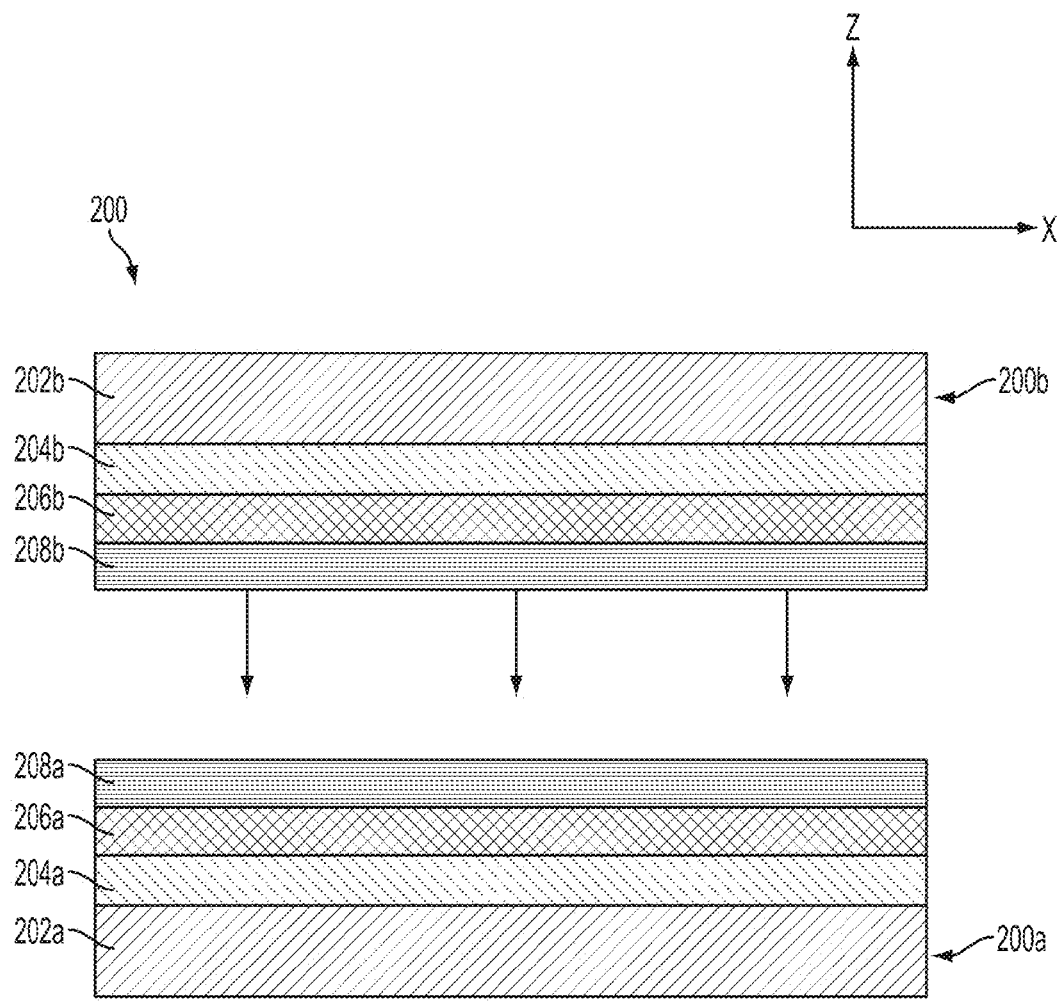
FIG. 7 illustrates first and second semiconductor wafers formed according to a wafer-to-wafer bonding process of the invention and arranged prior to being bonded to one another.

Turning to FIG. 7, a first semiconductor wafer 200a and a second semiconductor wafer 200b are arranged with respect to one another prior to performing a wafer-to-wafer bonding process according to a non-limiting embodiment of the invention. The first semiconductor wafer 200a and the second semiconductor wafer 200b are each formed according to the process flow shown in FIGS. 3-5 described in detail above. Accordingly, the first wafer 200a and the second wafer 200b each include a bulk substrate layer 202a/202b, an oxide layer 204a/204b formed on an upper surface of a respective bulk substrate layer 202a/202b, a crack-arresting film layer 206a/206b formed on an upper surface of a respective oxide layer 204a/204b, and a LTO layer 208a/208b (i.e., bonding layer) formed on an upper surface of a respective crack-arresting film layer 206a/206b.

Figure 8:
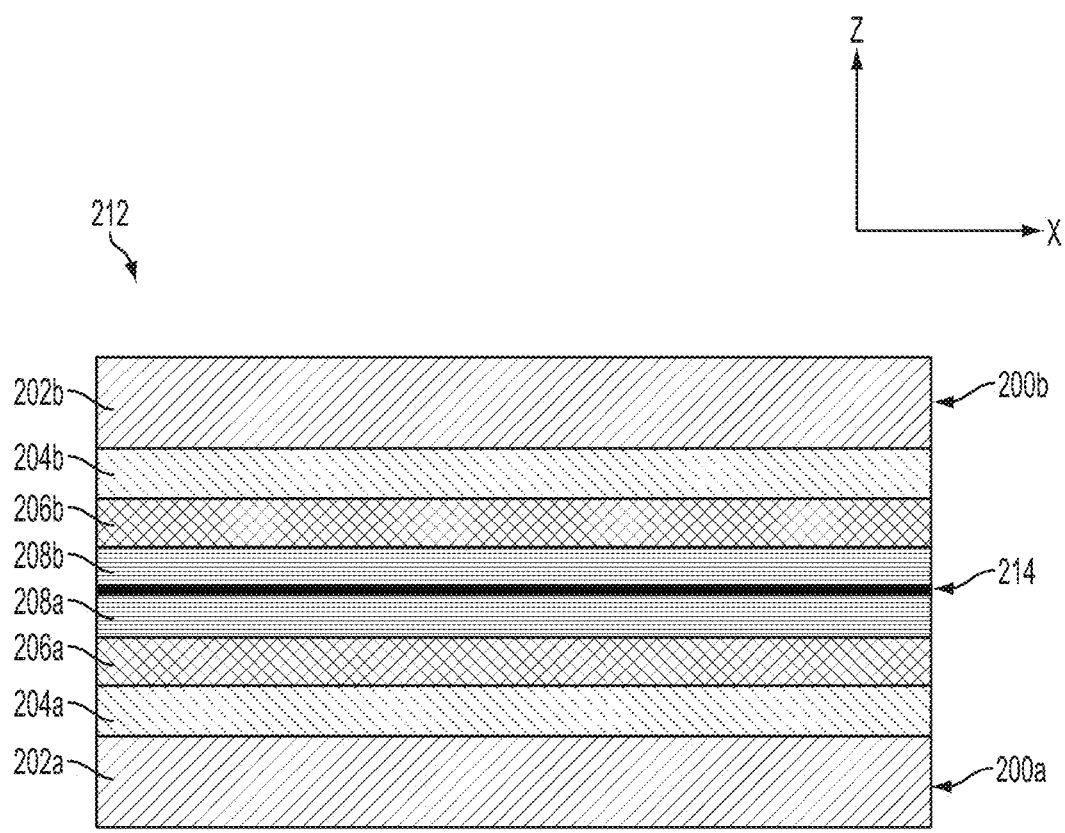
FIG. 8 illustrates the first semiconductor wafer bonded to the second semiconductor wafer following to a wafer-to-wafer bonding process that forms a semiconductor device having increased bonding energy at an oxide-oxide interface according to a non-limiting embodiment of the invention.

Turning now to FIG. 8, the LTO layer 208a of the first semiconductor wafer 200a is bonded to the LTO layer 208b of the second semiconductor wafer 200b according to a low-temperature wafer-to-wafer bonding process. In this manner, a wafer-to-wafer semiconductor device 212 is formed according to a non-limiting embodiment of the invention. According to a non-limiting embodiment, the low-temperature wafer-to-wafer bonding process includes an initial bonding operation performed at room temperature, followed by a permanent anneal operation performed at temperatures of approximately 350 degrees Celsius (° C.) or less. These low temperatures achieve various performance enhancements including high wafer alignment accuracy, high bonding energy, and high throughput, all of which are not realized by high temperature bonding processes (i.e., at temperatures in excess of 350° C.).

Figure 1:
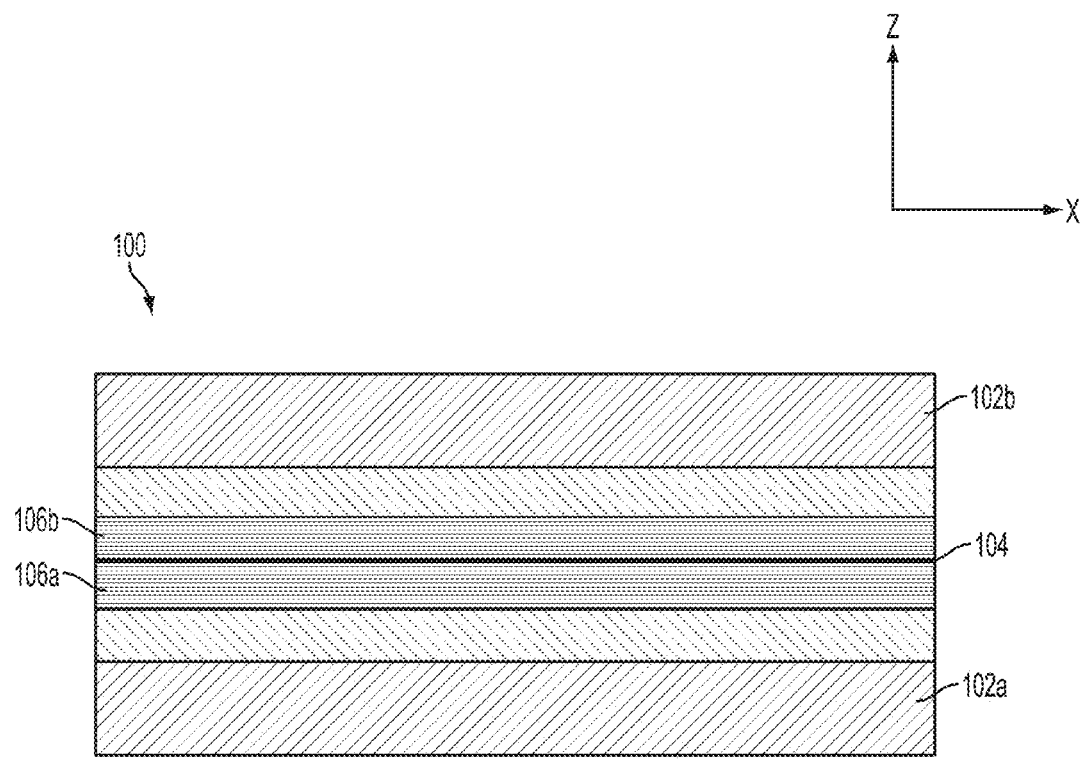
FIG. 1 is a cross-sectional view of a conventional semiconductor device formed according to a conventional wafer-to-wafer bonding process.

Due to the crack-arresting film layer 206a/206b formed in each of the first and second semiconductor wafers 200a/200b, the wafer-to-wafer semiconductor device 212 according to at least one embodiment of the invention has increased bonding energy at an oxide-oxide interface 214 (i.e., bonding interface 214) defined by the opposing LTO layers 208a/208b when compared to conventional wafer-to-wafer semiconductor devices 100 (see FIG. 1). According to an embodiment, the bonding energy at the oxide-oxide interface 214 ranges from approximately 15 $J/m^2$ to approximately 90 $J/m^2$, as compared to up to about 2 $J/m^2$ with conventional oxide bonding layer stacks. It is appreciated that the increased bonding energy realized by the wafer-to-wafer semiconductor device 212 of the present invention can be measured and demonstrated according to the Maszara method as understood by one of ordinary skill in the art. As a result a greater amount of force is required to break the bonding energy that bonds together the opposing LTO layers 208a/208b. In this manner, at least one embodiment of the invention reduces the susceptibility of separation between the opposing LTO layers 208a/208b at the oxide-oxide bonding interface 214 thereby enhancing the overall reliability of the wafer-to-wafer semiconductor device 212.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:
   forming a first semiconductor wafer including a first bonding layer on a first crack-arresting film layer, the first crack-arresting film layer comprising a low-dielectric material, the first bonding layer and the first crack-arresting film layer formed to ensure that each comprises a same first thickness;
   forming a second semiconductor wafer including a second bonding layer; and
   bonding the first bonding layer to the second bonding layer;
   wherein the first crack-arresting film layer is operable to strengthen a bond at a bonding interface defined by the first and second bonding layers.

2. The method of claim 1, wherein forming the second semiconductor wafer includes forming the second bonding layer on a second crack-arresting film layer, the second crack-arresting film layer comprising a low-dielectric material.

3. The method of claim 2, further comprising interposing the first crack-arresting film layer between the first bonding layer and a first bulk substrate layer of the first semiconductor substrate, and interposing the second crack-arresting film layer between the second bonding layer and a second bulk substrate layer of the second semiconductor substrate.

4. The method of claim 1, wherein the low-k dielectric material is octamethylcyclotetrasiloxane (OMCTS).

5. The method of claim 1, wherein the bond at the bonding interface comprises a bonding energy of approximately 15 $J/m^2$ to approximately 90 $J/m^2$.

6. A method of fabricating a wafer-to-wafer semiconductor device, the method comprising:
   forming a first wafer substrate comprising a first bonding layer formed on a first bulk substrate layer;
   forming a second wafer substrate comprising a second bonding layer formed on a second bulk substrate layer; and
   bonding the second bonding layer to the first bonding layer to define a bonding interface;
   wherein the first wafer substrate comprises:
   a first oxide layer formed on an upper surface of the first bulk substrate layer, the first bulk substrate layer and the first oxide layer each extending along a first axis to define a first length and a second axis opposite the first axis to define a first thickness;
   a first crack-arresting layer formed on an upper surface of the first oxide layer; and
   the first bonding layer formed on an upper surface of the first crack-arresting layer such that the first crack-arresting layer is interposed between the first bond layer and the first oxide layer, the first crack-arresting layer configured to inhibit formation of at least one uniform crack in the first bonding layer; and
   wherein the second wafer substrate comprises:
   a second oxide layer formed on an upper surface of the second substrate layer;
   a second crack-arresting layer formed on an upper surface of the second oxide layer; and
   the second bonding layer formed on an upper surface of the second crack-arresting layer such that the second crack-arresting layer is interposed between the second bond layer and the second oxide layer, the second crack-arresting layer configured to inhibit formation of at least one uniform crack in the second bonding layer;
   the first and second crack-arresting layers configured to increase a bonding energy of the bonding interface.

* * * * *